US006828647B2

(12) United States Patent
Schafbauer et al.

(10) Patent No.: US 6,828,647 B2
(45) Date of Patent: Dec. 7, 2004

(54) STRUCTURE FOR DETERMINING EDGES OF REGIONS IN A SEMICONDUCTOR WAFER

(75) Inventors: Thomas Schafbauer, Paris (FR); Andreas Von Ehrenwall, Dresden (DE); Tobias Mono, Dresden (DE)

(73) Assignee: Infineon Technologies AG (DE)

( * ) Notice: Subject to any disclaimer, the term of this patent is extended or adjusted under 35 U.S.C. 154(b) by 7 days.

(21) Appl. No.: 09/826,732

(22) Filed: Apr. 5, 2001

(65) Prior Publication Data

US 2003/0186470 A1 Oct. 2, 2003

(51) Int. Cl.[7] .......................... H01L 29/00; H01L 21/66
(52) U.S. Cl. .......................... 257/509; 257/653; 438/14
(58) Field of Search .......................... 257/48, 509, 647, 257/653; 438/14, 225, 297, 362, 439

(56) References Cited

U.S. PATENT DOCUMENTS

| | | | |
|---|---|---|---|
| 5,256,577 A | | 10/1993 | Pluntke et al. |
| 5,699,282 A | | 12/1997 | Allen et al. |
| 5,861,679 A | | 1/1999 | Nagano |
| 5,916,715 A | | 6/1999 | Fulford et al. |
| 6,072,192 A | * | 6/2000 | Fulford et al. ................. 257/48 |
| 6,118,137 A | | 9/2000 | Fulford, Jr. et al. |

OTHER PUBLICATIONS

Patent Abstracts of Japan, vol. 006, No. 119 (E–116), Jul. 3, 1982 & JP 57 045946 A (NEC Corp), Mar. 16, 1982 abstract; figure 1.

Patent Abstracts of Japan, vol. 016, No. 200 (E–1201), May 13, 1992, & JP 04 032216 A (Mitsubishi Electric Corp.) Feb. 4, 1992 abstract; figures 1–8.

Patent Abstracts of Japan, vol. 1995, No. 10, Nov. 30, 1995 (& JP 07 183351 A (Matsushita Electron Corp), Jul. 21, 1995 abstract; figures 1–3).

Patent Abstracts of Japan, vol. 015, No. 036 (E–1027), Jan. 29, 1991 & JP 02 273954 A (Fujitsu Ltd), Nov. 8, 1990 abstract; figures 1–8.

Patent Abstracts of Japan, vol. 008, No. 142 (E–254), Jul. 3, 1984 & JP 59 051529 A (Matsushita Denki Sangyo KK), Mar. 26, 1984 abstract; figures 2, 3, 5–7.

International Search Report.

* cited by examiner

*Primary Examiner*—Alonzo Chambliss
(74) *Attorney, Agent, or Firm*—Lerner, David, Littenberg, Krumholz & Mentlik, LLP

(57) ABSTRACT

A method for electrically determining in a semiconductor wafer the location of edges of a well that underlies an insulating layer that includes forming in the wafer before forming of the well and the insulating layer a plurality of conductive stripes will that pass under the future insulating layer and extend to varying distances under the insulating layer so as to include stripes that will penetrate an edge to be located so as to form a low resistance connection thereto and stripes that will fall short of an edge to be located. From the stripes of minimum penetration that make low resistance can be determined the location of the well edges.

4 Claims, 4 Drawing Sheets

STRUCTURE FOR DETERMINING EDGES OF REGIONS IN A SEMICONDUCTOR WAFER

FIELD OF THE INVENTION

This invention is a technique useful in the manufacture of integrated circuits and, more particularly, relates to determining the edges of wells of one conductivity type formed in regions of opposite conductivity type in semiconductor wafers in which the integrated circuits are being formed.

BACKGROUND OF THE INVENTION

Many of todays integrated circuit devices have semiconductor bodies (substrates) of one conductivity type and regions (wells) formed therein of the opposite conductivity type. Generally these wells are formed by diffusion or implantation processes using, for control, masks that have been patterned by photolithography. Typically the wells are regions that extend horizontally between one and ten microns wide. It is generally important to determine the edges of such wells with an accuracy of about plus or minus ten nanometers. However, photolithographic processes are subject to process variations that make it difficult to establish with the desired high accuracy the precise edges of the wells formed, especially when such edges underlie an insulating layer. In particular, it is difficult to locate precisely the edge of the photoresist mask that is used to locate the edges of the wells being formed. These uncertainties in knowledge of where the well edges are can cause complications in the processing of large scale integrated circuits where some circuit elements are to be positioned near edges in the wells. The process of determining accurately the location of well edges is complicated when, at the stage at which the edges need to be located, the well edges may be only 100 nanometers wide and covered with an insulating layer that makes surface probing ineffective, and also the edge determination needs to be done in a manner that is non-destructive. Moreover, the fact that the well edges are buried below insulating surface layers also make optical probing techniques burdensome.

The present invention provides a new approach that should be less burdensome than prior techniques. In particular, the approach is one that should be more readily automated to provide edge information for all the chips of a wafer.

SUMMARY OF THE INVENTION

Broadly the invention provides a technique for locating electrically the edge of a vertical p-n junction that underlies an insulating layer in a semiconductor body.

Basically it involves initially providing at the surface of a region of the semiconductor body of one conducting type a plurality of conductive stripes that are of the opposite conductivity type and are designed to extend below the later-to-be-formed overlying insulating layer to varying extents and of which at least one extends across the later-to-be-formed junction edge that is to be located. Stripes that extend across the junction edge are identified by a higher current that flows in such stripes when the stripes are appropriately biased. From these there can be identified ones that extend just beyond the edge.

More specifically, the invention involves locating on the wafer over the surface region where there is to be formed a well whose edge is to be determined, an overlay pattern comprising a series of conductive stripes. Each stripe serves as a fixed probe to determine the conductivity of the surface region at which the buried end of it terminates. Each stripe advantageously is connected to a separate conductive pad for easy access and a multiplexing circuit is used to interconnect appropriate pairs of pads. There can be located the edge of a particular well region by subsequently applying a voltage and measuring any resulting current flow between different pairs of such stripes. A variety of overlay stripe patterns are feasible for locating either a single edge or a pair of edges of the well.

From a first apparatus aspect, the present invention is semiconductor apparatus. The semiconductor apparatus comprises a semiconductor body having a top surface and being of a first conductivity type and including an insulating layer over a portion of the top surface, a semiconductor region of a second opposite conductivity type adjacent said semiconductor body for forming a p-n junction with the semiconductor body which underlies the insulating layer, and a plurality of spaced-apart conductive stripes. The plurality of spaced-apart conductive strips each have first and second ends with the first ends at the top surface of the semiconductor body and the second ends buried under the insulating layer, and with the second end of at least one of the conductive strips making low resistance contact with the semiconductor region and at least one failing to make a low resistance contact.

From a second apparatus aspect, the present invention is semiconductor apparatus comprising a silicon wafer, an insulating layer, and a plurality of conductive stripes. The silicon wafer comprises a portion that includes at least one calibration well of the conductivity type opposite that of its surrounding region for forming a vertical p-n junction therewith. The insulating layer overlies the p-n junction. The plurality of conductive stripes extend from the top surface of the portion and have buried ends underlying partially the insulating layer for forming distinct conductive paths in said surrounding region and directed at the vertical edge of the p-n junction of which at least one conductive stripe penetrates the junction to form a conductive path to the well and at least one that falls short of the junction. At least one other conductive connection to the well for forming a conductive path through the calibration well with a penetrating stripe.

From a first method aspect, the present invention is a method for locating an edge of a semiconductor well of one conductivity that is formed in a semiconductor body of the opposite conductivity type which edge underlies an insulating layer. The method comprises the steps of: forming in the semiconductor body before the semiconductor region and the insulating layer are formed a plurality of distinct conductive stripes of each includes a first end at the top surface of the semiconductor body and a second end buried under a portion of the top surface where the insulating layer is to be formed, of which at least one conductive stripe has a second end extends across the edge and at least one second end that be short of the edge; forming an insulating layer over a portion of the top surface of the semiconductor body and covering the second ends of the stripes; forming in the semiconductor body a semiconductor well of the opposite conductivity type for forming the edge that underlies the insulating layer whose edge is to be located, said semiconductor well including the buried second ends of only some but less than all of the conductive stripes; and determining which of the stripes includes buried second ends that make low resistance connections to the semiconductor well.

From a second method aspect, the present invention is a method for determining in a semiconductor wafer an edge that is of a well of conductivity different from its surrounding region and that underlies an insulating layer that overlies the edge of the well, said method includes forming over the surface before the forming of either the insulating layer or the well an overlay pattern of spaced-apart conductive stripes that extend under the insulating layer to be formed to provide distinct conductive paths in the semiconductor wafer, of which at least one extends sufficiently to penetrate the edge of the well to be formed to provide a low resistance connection to the well after it has been formed.

From a third method aspect the present invention is a method of determining in a semiconductor wafer the location of two opposed edges that are of a well of conductivity type opposite that of the surrounding region and that underlie an insulating layer by forming over the surface of the wafer before forming of the well an overlay pattern of conductive stripes that extend under the insulating layer to be formed and that comprise a first and second set of which at least one of the first set penetrates the well at the first of the opposed edges to form a low resistance connection to the well and at least one of the second set penetrates the well at the other of the opposed edges to form a low resistance connection to the well.

The invention will be better understood from the following more detailed description taken in conjunction with the accompanying drawing.

DETAILED DESCRIPTION

Figure 1:
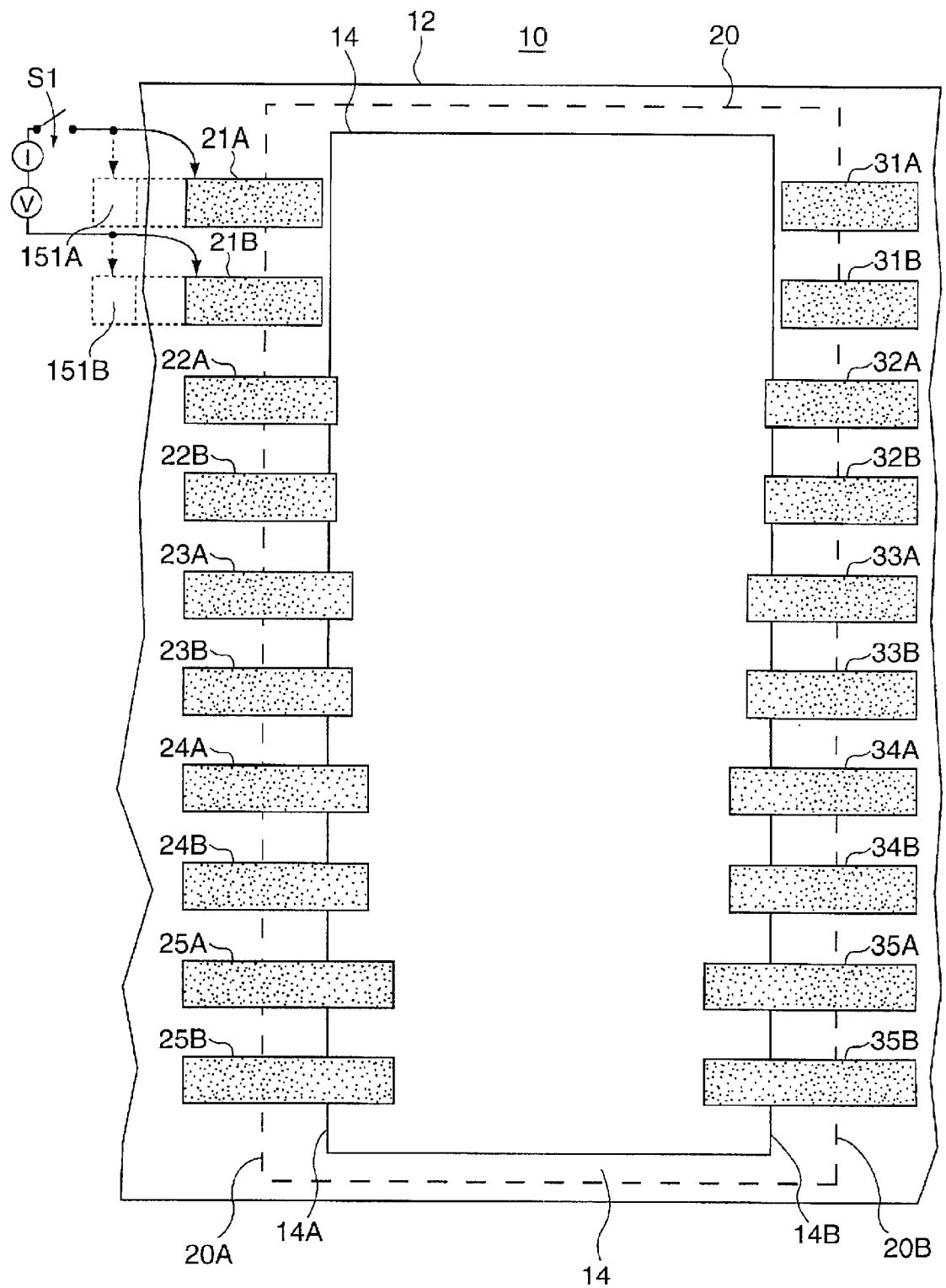
FIG. 1 shows a schematic top view of a portion of a silicon wafer that includes a well and an overlying insulating layer and a exemplary overlay pattern of conductive stripes useful for determining the location of vertical edges of the well underlying the insulating layer in accordance with the present invention.

In the manufacture of integrated circuit devices of the kind to which the invention generally pertains, one typically begins with a large monocrystalline wafer, typically at least eight inches in diameter, that is of relatively high resistivity silicon. Eventually the wafer will be diced into a large number of chips, each of which will include one or more integrated circuits. Generally much of the processing will be done on a wafer scale to keep production costs low. Photolithographic processes are used to define the chip areas and the integrated circuit patterns within each chip area. Typically within each chip portion there will be included shallow isolation trenches or localized regions of isolation (LOCOS) filled with oxide to help define active areas within each chip portion. Generally within each chip area there will be formed wells of different conductivity types whose edges underlie the oxide regions, and which edges need to be located to maintain tight control of the processing of the chip. These well-edge locations generally are fixed by the edges of the layer of photoresist that forms the mask that is used to localize the well as it is being formed, typically by ion implantation. However, there is generally uncertainty in the precise location of the resist edges. This uncertainty results in uncertainty in the location of the well edges, and the main role of the present invention is to resolve the uncertainty by providing a process for locating electronically the edges of wells (semiconductor regions) underlying the shallow isolation trenches.

To this end, in accordance with the invention, after the shallow isolation trenches are formed, but before the trenches are filled with insulation, an overlay pattern of conductive stripes is formed over a surface region where a well, of which an edge whose location needs to be accurately located, is to extend buried below an isolation trench. These stripes advantageously are of semiconductor of a conductivity-type opposite that of the wafer portion in which they are being formed so that they can serve effectively as distinct conductive paths within such portion. Buried ends of the stripes extend various distances below the trench so as to extend both short and long of a position to intersect the vertical edge of the well to be subsequently formed. After the trenches are filled the stripes will partially underlie the overlying insulating fill of the trench. Since such wells typically will be of the same conductivity type as that of the stripes, any stripe that penetrates into the well will effectively be a low resistance connection to the well. However, stripes that extend short of reaching the well will not serve as low resistance connections to the well.

By applying a suitable voltage bias to the stripes, there are identified the stripes that penetrate the well edge whose location is to be determined. From such stripes there can be determined the stripe the position of whose buried end best corresponds to the position of an edge of the well.

Various stripe patterns can be utilized and the choice depends on the accuracy desired and the shape anticipated of the well edge whose location is to be determined.

Usually the closer the stripe spacing, the narrower the width of the stripes, and the smaller the difference in trench extent of adjacent stripes, the more accurately the location and the shape of the edge can be determined. Generally a stripe of a width of 0.1 to 1.0 micron with a spacing of 0.1 to 1.0 micron, and a difference in trench extent of 0.05 to 0.4 micron should be adequate for devices that represent the present state of the art. Subsequent developments may call for even closer spacing, narrower widths, and smaller differences.

Referring now to FIG. 1, there is shown a top view of a portion of a semiconductor structure (apparatus) 10 in accordance with the present invention. Semiconductor structure 10 comprises a semiconductor wafer (body) 12, typically largely silicon of a first conductivity type, i.e., p-type, that includes a trench-shaped well (region) 14 of the opposite conductivity type, i.e., n-type. Vertical edges 14A and 14B of the well 14 define the location of p-n junction whose location is to be determined. The wafer 14 has a surface layer 20 of insulation (shown by a dashed line rectangle), typically silicon oxide, covering a portion thereof and overlying the well 14. Typically, the layer 20 typically will be the fill of an isolation trench and the well 14 edges 14A, 14B are located underlie such layer 20. In a first embodiment the invention involves locating the edges 14A and 14B which defines the well 14. For purposes of illustration, as indicated above, the well 14 is of n-type conductivity and that semiconductor body 12 is of p-type conductivity. There is shown an overlay of conductive stripes that include a first set of pairs 21A, 21B; 22A, 22B; 23A, 23B; 24A, 24B; and 25A, 25B adjacent edge 14A with all but conductive stripes 21A, 21B extending into the well 14. The overlay of conductive stripes also includes a second set of pairs 31A, 31B; 32A, 32B; 33A, 33B; 34A, 34B; and 35A, 35B. The second set of pairs of stripes are adjacent edge 14B with all but conductive stripes 31A, 31B extending into well 14. As shown, the two stripes of each pair approach an adjacent well edge essentially to the same extent. Each of the conductive stripes has first and second ends of which only the second ends extend below the insulating layer 20. Each of the first ends of the stripes advantageously is connected to a larger pad for easier access. As shown, second ends of progressively higher numbered stripes approach the edges more closely, and stripes 22A, 22B, and 32A; 32B actually extend into well 12. As shown, the pair of stripes 22A, 22B, and the pair of stripes 32A; 32B have the shortest overlap of the edges 20A and 20B, respectively.

It should now be apparent that if there is identified the stripes whose buried end makes a low resistance connection to the well 14, the location of such buried end of shortest distance into the well 14 will essentially also be the location of the corresponding edge of the well 14. In the example shown, these will be stripes 22A, 22B for edge 14A. In the example shown, the location of buried ends 22A and 22B will essentially also be the location of edge 14A. Similarly, the location of the buried ends of stripes 32A and 32B will essentially be the location of edge 14B.

It can be appreciated that if the location of edge 14A alone is to be determined, it is sufficient to apply a voltage only between different pairs of the first set of stripes. Similarly, to locate the edge 14B of the well 14, one can use only the second set of stripes. Alteratively, it is feasible to identify the edge 14A by first combining in turn each of the stripes of the first set with a strip of the second set known to extend into the well to locate the buried end of the stripe of the first set of stripes of shortest extend into the well 14.

Where the location of both edges 14A and 14B, which define vertical side walls of the well 14, are to be determined, as in the first example, the bias voltage may be established between pairs of stripes, including one from each set, to identify pairs of stripes of shortest extent which contact the well 14. In the example shown these would include any pair that did not include 21A, 21B, and 31A, 31B. The identification of the stripes whose buried ends penetrate a well edge can be made by applying a voltage between different pairs of stripes to identify pairs between which an applied voltage will provide a significant current flow, and selecting from such pairs.

It can be appreciated that a variety of arrangements can be used to apply the appropriate bias to different pairs of stripes and to detect the current flow associated with the different pairs to identify the pairs that provide significant current flow. To minimize the complexity of the necessary arrangement, there can be designed a suitable switch for applying the voltage in turn to the various selected pairs of stripes. In particular, the switch may be of the digital form in which digital pulses are used to select particular pairs of stripes. In the interest of simplifying the drawing, there is shown the series combination of a switch S1, a current meter A, and a voltage source V. A first output terminal of the voltage source V is coupled to a first terminal of the current meter I and a second terminal of the current meter a is coupled to a first terminal of the switch S1. The current meter I coupled be a resistor with a voltage meter placed across it output terminals. A second terminal of switch S1 is coupled to conductive strip 21A or optionally to a probe pad 151A which is shown in dashed lines. A second terminal of the voltage supply is coupled to the conductive strip 21B or optionly to a probe pad 151B. Probe pads 151A and 151B and a separate probe pad for each of the stripes 22A–25B and 31A–35B can be used to facilitate easier probing since the probe pads can have a greater distance between them than the stripes. With switch S1 closed (the opposite position shown in FIG. 1), if the two stripes contact well 14 there is established an electrical path from the voltage source V through the current meter I and the switch S1 which results in a flow of current. In the case of stripes 21A and 21B, no electrical path is created through well 14 since these stripes do not contact well 14. An electrical path through well 14 would be established if voltage source V is placed across these stripes and switch S1 is closed. The same is true for stripes 32A and 32B.

Figure 2:
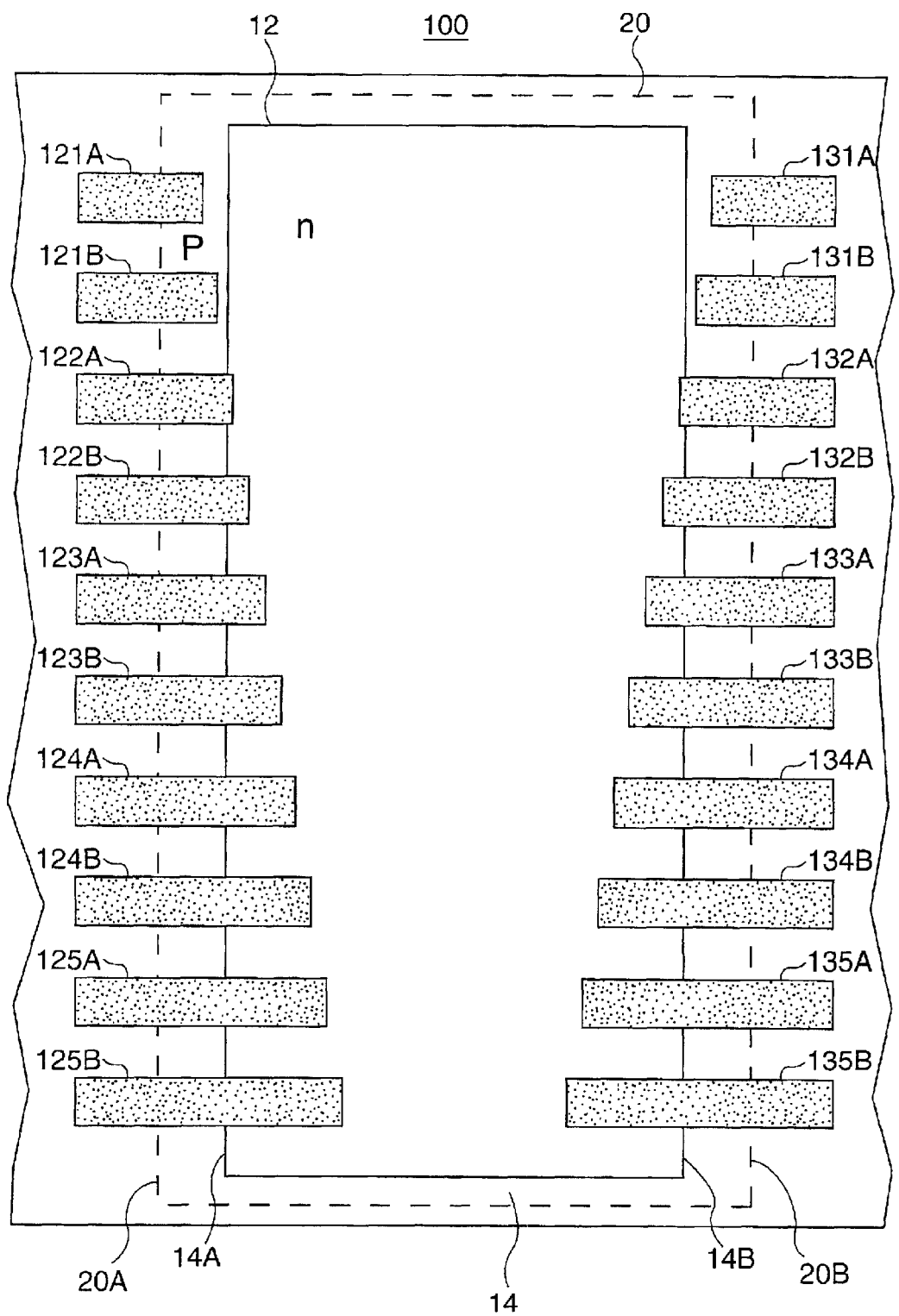
FIGS. 2, 3, and 4 show schematic top views of portions of a silicon wafer that includes such a well and exemplary overlay patterns of conductive stripes useful for determining the location of vertical edges of the well underlying the insulating layer in accordance with the present invention.

Referring now to FIG. 2, there is shown a top view of a portion of a semiconductor structure 100 in accordance with an other embodiment of the present invention. Structure 100 of FIG. 2 is similar to structure 10 of FIG. 1. Components of structures 10 and 100 which are essentially the same have the same reference number designation. Components of structure 100 which are similar to corresponding components of structure 10 of FIG. 1 have the same reference number with a 100 added thereto. The essential difference between structures 10 and 100 is that each of the conductive stripes 121A–125B, and 131A–135B increase in length as is shown. In this and succeeding embodiments shown in FIGS. 3 and 4, the series combination of supply voltage source V, current meter I, and switch S1 are coupled between pairs of conductive stripes that include one from each of the opposite sides (edges 14A and 14B) of the well 12.

Figure 3:
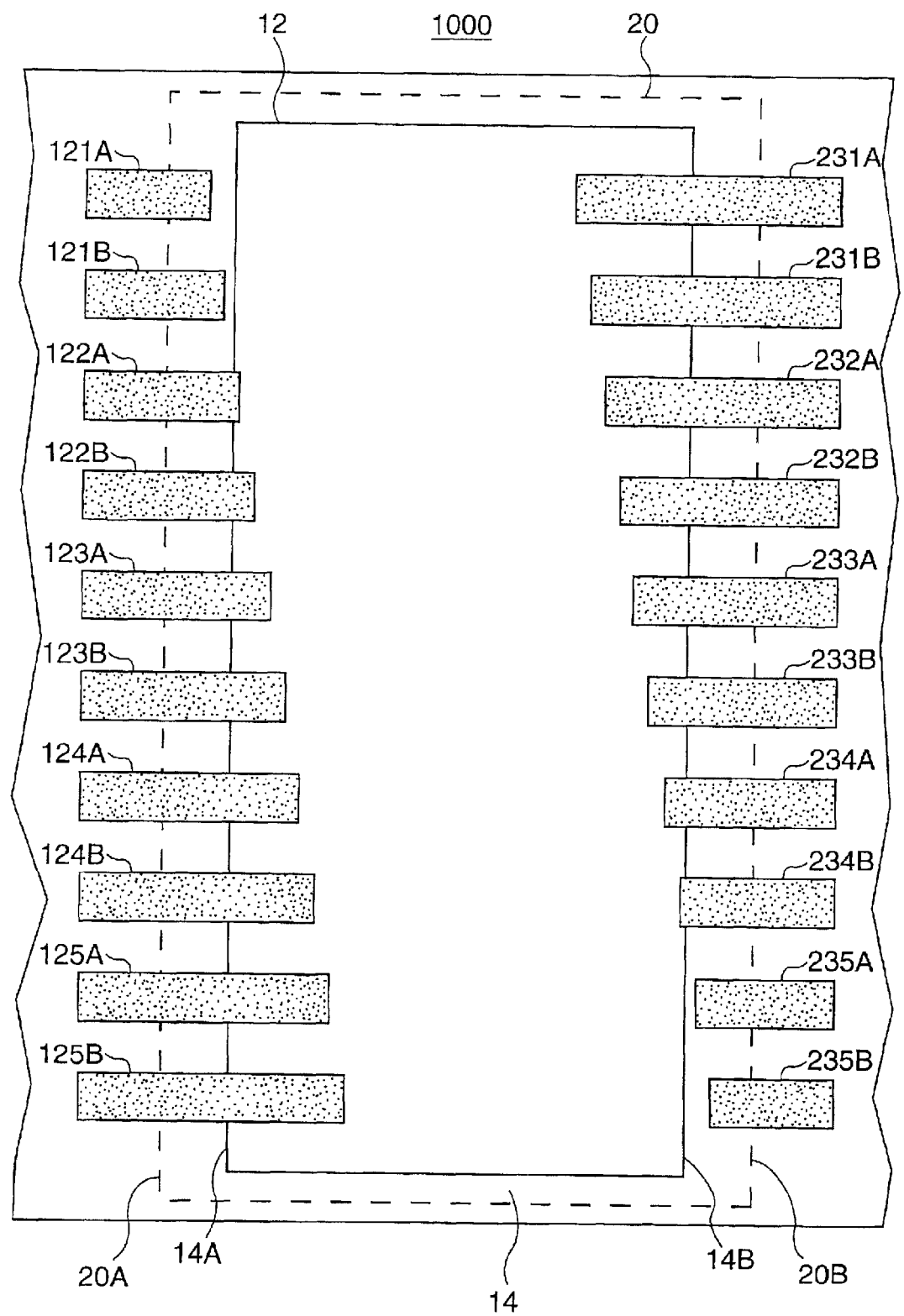

Referring now to FIG. 3, there is shown a top view of a portion of a semiconductor structure 1000 in accordance with another embodiment of the present invention. Structure 1000 is very similar to structure 100 of FIG. 2. Components of structures 1000 and 100 which are essentially the same have the same reference designation. Components of structure 1000 which are similar to corresponding components of structure 100 of FIG. 2 have the same reference numeral with 100 added thereto. The essential difference between structures 1000 and 100 is that conductive stripes 231A–235B of structure 1000 start with the longest at the top and then decrease in length. The voltage source V, current meter I, and the switch S1 (not shown in FIG. 3) are again connected to pairs of conductive stripes made up of a stripe from one on each side 14A and 14B of the well 12.

Figure 4:
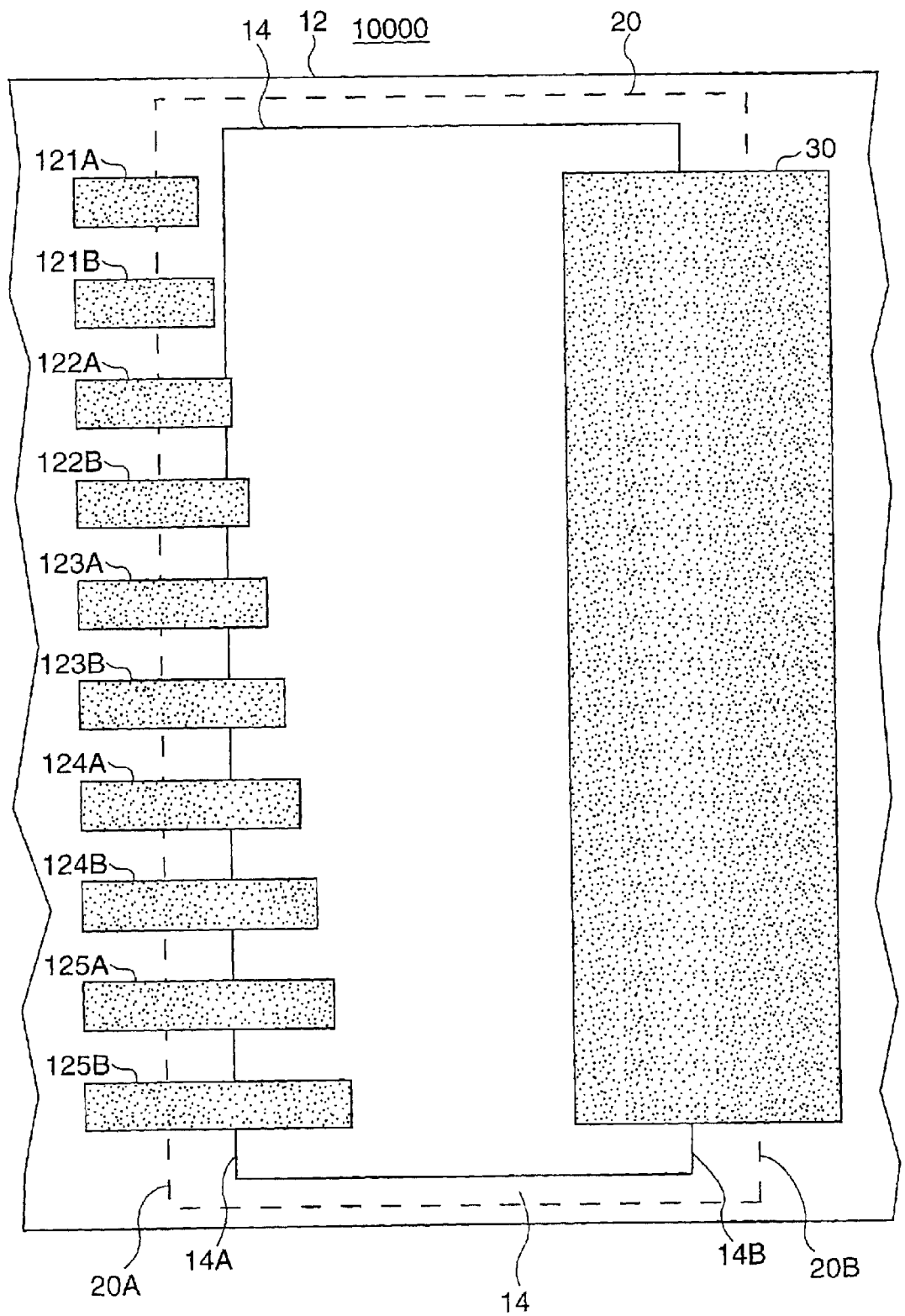

Referring now to FIG. 4, there is shown a top view of a portion of a semiconductor structure 10000 in accordance with an other embodiment of the present invention. Structure 10000 is very similar to structure 100 of FIG. 2. Components of structures 10000 and 100 that are essentially the same have the same reference designation with the addition of 200. The essential difference between structures 10000 and 100 is that a single large conductive strip 30 is substituted for the plurality of pairs of conductive strips on the right side of well 14 and this stripe 30 extends into the well 14. This arrangement accordingly is suitable only for locating the edge 14A of the well 12. The voltage source V, current meter I, and the switch S1 (not shown in FIG. 4) are again connected pairs made up of a stripe from one on each side of the well 12.

As previously discussed, if only the edge 14A of the well 12 is to be located, the overlay pattern shown in FIG. 1 is also well suited.

Such a situation arises for example, when a well is formed that involves positioning only a single edge of a photoresist mask used for ion implantation over the isolation trench that forms the overlying insulating layer. In such a case only one well edge whose location needs to be determined extends under the insulating layer.

Moreover, in situations where single edges of two different wells underlie a common isolation trench, the location of each of the two different edges can be determined independently in the manner just discussed.

It is expected that it will become advantageous in many instances for calibration of the mask used to form the wells in a chip to include in each chip portion of a wafer at least one well that forms a p-n junction having a vertical edge with the surrounding region and to include in such chip portion for such calibration a plurality of conductive stripes that form distinct conductive paths of which at least one will fall short of the well and at least one will penetrate the vertical edge of the well so that the location of the well edge can be located.

It can be appreciated from the foregoing that the basic principles of the invention are applicable to a variety of different situations so that the specific example described should be viewed merely as illustrative and that a variety of other embodiments may be devised by a worker in the art without departing from the principles of the invention.

What is claimed is:

1. Semiconductor apparatus comprising:
   a semiconductor body having a top surface and being of a first conductivity type and including an insulating layer over a portion of the top surface;
   a semiconductor region of a second opposite conductivity type adjacent said semiconductor body for forming a p-n junction with the semiconductor body which underlies the insulating layer; and
   a plurality of spaced-apart conductive strips each having first and second ends with the first ends at the top surface of the semiconductor body and the second ends buried under the insulating layer, and with the second end of at least one of the conductive strips making low resistance contact with the semiconductor region and at least one failing to make a low resistance contact.

2. The semiconductor apparatus of claim 1 wherein the conductive strips are doped semiconductor material of the second conductivity type.

3. The semiconductor apparatus of claim 2 wherein at least two of the conductive stripes make a low resistance contact to the semiconductor region.

4. Semiconductor apparatus comprising:
   a silicon wafer comprising a portion that includes at least one calibration well of the conductivity type opposite that of its surrounding region for forming a vertical p-n junction therewith;
   an insulating layer overlying the p-n junction;
   a plurality of conductive stripes extending from the top surface of the portion and having buried ends underlying partially the insulating layer for forming distinct conductive paths in said surrounding region and directed at the vertical edge of the p-n junction of which at least one conductive stripe penetrates the junction to form a conductive path to the well and at least one that falls short of the junction; and
   at least one other conductive connection to the well for forming a conductive path through the calibration well with a penetrating stripe.

* * * * *